(12) United States Patent
Lim et al.

(10) Patent No.: US 6,617,885 B2
(45) Date of Patent: Sep. 9, 2003

(54) SENSE AMPLIFIERS HAVING GAIN CONTROL CIRCUITS THEREIN THAT INHIBIT SIGNAL OSCILLATIONS

(75) Inventors: Jong-hyoung Lim, Kyungki-do (KR); Kyoung-woo Kang, Kyungki-do (KR); Dong-ho Hyun, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/916,774

(22) Filed: Jul. 27, 2001

(65) Prior Publication Data

US 2002/0021147 A1 Feb. 21, 2002

(30) Foreign Application Priority Data

Aug. 9, 2000 (KR) ........................................ 2000-46094

(51) Int. Cl.[7] ............................ G01R 19/00; G11C 7/00; H03F 3/45
(52) U.S. Cl. ............................................. 327/57; 327/51
(58) Field of Search ...................... 327/51, 52, 53–57, 327/65, 66, 67, 77, 85, 89; 365/207, 196

(56) References Cited

U.S. PATENT DOCUMENTS

| | | | |
|---|---|---|---|
| 4,370,737 A | 1/1983 | Chan | 365/203 |
| 4,551,641 A * | 11/1985 | Pelley, III | 327/52 |
| 4,739,198 A * | 4/1988 | Maruyama | 327/52 |
| 4,845,672 A * | 7/1989 | Watanabe et al. | 365/208 |
| 5,258,959 A | 11/1993 | Dallabora et al. | 365/210 |
| 5,544,110 A * | 8/1996 | Yuh | 327/55 |
| 5,553,295 A | 9/1996 | Pantelakis et al. | 395/750 |
| 5,615,161 A | 3/1997 | Mu | 365/208 |
| 5,953,259 A | 9/1999 | Yoon et al. | 365/189.04 |
| 5,959,913 A | 9/1999 | Raad | 365/201 |
| 5,963,495 A * | 10/1999 | Kumar | 365/207 |
| 6,072,738 A | 6/2000 | Brown | 365/203 |
| 6,147,514 A * | 11/2000 | Shiratake | 327/55 |
| 6,331,791 B1 * | 12/2001 | Huang | 326/98 |

FOREIGN PATENT DOCUMENTS

| | | |
|---|---|---|
| KR | 92-8756 | 5/1992 |
| KR | 92-20241 | 11/1992 |
| KR | 157291 | 7/1998 |

OTHER PUBLICATIONS

Notice to Submit Response, Korean App. No. 10–1998–0059420, Nov. 24, 2000.

* cited by examiner

*Primary Examiner*—Tuan T. Lam
(74) *Attorney, Agent, or Firm*—Myers Bigel Sibley & Sajovec PA

(57) ABSTRACT

Integrated circuit memory devices according to the present invention include a sense amplifier having a pair of differential input signal lines, a pair of differential output signal lines, and a current amplifier. The current amplifier has an input stage electrically coupled to the pair of differential input signal lines and an output stage electrically coupled to the pair of differential output signal lines. The input stage and/or the output stage are responsive to a first control signal that reduces a gain of the current amplifier when the first control signal is asserted.

11 Claims, 7 Drawing Sheets

SENSE AMPLIFIERS HAVING GAIN CONTROL CIRCUITS THEREIN THAT INHIBIT SIGNAL OSCILLATIONS

RELATED APPLICATION

This application is related to Korean Application No. 2000-46094, filed Aug. 9, 2000, the disclosure of which is hereby incorporated herein by reference.

BACKGROUND OF THE INVENTION

The present invention generally relates to integrated circuit devices, and more particularly, to sense amplifiers.

Recently, in accordance with a trend towards high performance and miniaturization, the operating speed of semiconductor memory devices has been significantly increased, while the overall size of these devices has been reduced. Sensing and amplifying data stored in these memory devices is typically one of the main functions performed by these devices. Thus, since most semiconductor memory devices use analog techniques for sensing data, it is highly desirable to optimize a sensing method for use in conjunction with these high speed semiconductor memory devices.

A conventional data amplifier typically has a fixed gain during normal operation of the semiconductor device. Some conventional data amplifiers may have a gain that varies with the operation mode of the semiconductor device. Thus, it is difficult to provide a stable output waveform due to changes in the level and phase of the input potential provided to a data amplifier. In general, the frequency band of a data amplifier is on the order of hundreds of megahertz (MHz). Therefore, input potential and impedance need to be appropriately considered. If a mismatch between these factors exists, the output gain may be reduced and/or the output waveform may oscillate. Thus, the operating speed of a semiconductor device may be degraded and invalid data may result. Furthermore, as the size of these semiconductor devices continues to be reduced, the distance between transmission lines of input signals will typically become closer, which could cause the occurrence of noise due to crosstalk between adjacent transmission lines, thus, increasing the possibility of outputting invalid data.

SUMMARY OF THE INVENTION

Integrated circuit memory devices according to embodiments of the present invention include a sense amplifier having a pair of differential input signal lines, a pair of differential output signal lines and a current amplifier. The current amplifier has an input stage electrically coupled to the pair of differential input signal lines and an output stage electrically coupled to the pair of differential output signal lines. The input stage and/or the output stage may be responsive to a first control signal that reduces a gain of the current amplifier when the first control signal is asserted.

In further embodiments of the present invention the input stage of the current sense amplifier may include a load circuit that is electrically coupled to the pair of differential input signal lines and a first reference signal line. The load circuit may be responsive to the first control signal and a second control signal. During a sense and amplify time interval, an impedance of a load provided by the load circuit to the pair of differential input signal lines may increase from a first level when the second control signal is being asserted and the first control signal is not being asserted to a second level, higher than the first level, when the first and second control signals are both being asserted.

In other embodiments of the present invention, the output stage may include an enable circuit that is electrically coupled to the pair of differential output signal lines and a second reference signal line. The enable circuit may be responsive to the first control signal and an enable signal. During a sense and amplify time interval, an impedance of a load provided by the enable circuit to the pair of differential output signal lines may increase from a third level when the enable signal is being asserted and the first control signal is not being asserted to a fourth level, higher than the third, level when the first control signal and enable signal are both being asserted.

In still further embodiments of the present invention the output stage may include a stabilizer circuit that is electrically coupled to the pair of differential output signal lines and a third reference signal line. The stabilizer circuit may be responsive to the first control signal. During a sense and amplify time interval, an impedance of a load provided by the stabilizer circuit to the pair of differential output signal lines may increase from a fifth level to a sixth level when the first control signal is being asserted.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout.

Figure 1:
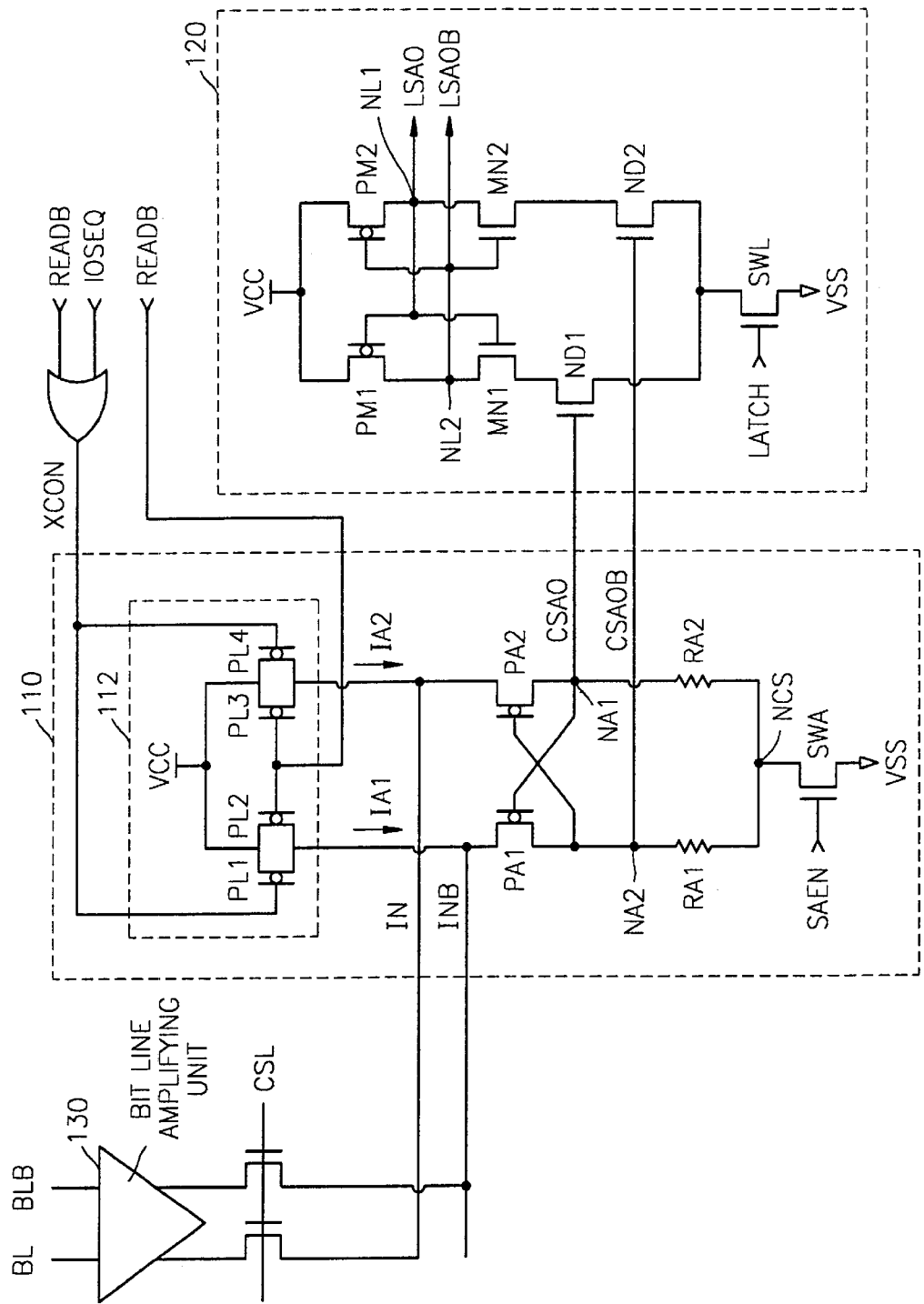
FIG. 1 illustrates a sense amplifier of a semiconductor device according to embodiments of the present invention.

Referring to FIG. 1, a sense amplifier of a semiconductor device according to embodiments of the invention will now be described. The sense amplifier includes a pair of differential input signal lines IN and INB, a current input amplifying unit 110 (i.e., a current amplifier), and a latch amplifying unit 120. The current input amplifying unit 110 may sense and amplify data received on the pair of differential input signal lines IN and INB, in response to a sense amplifier enable signal SAEN. The sense amplifier enable signal SAEN is a signal that is activated when the semiconductor device goes into a read mode. The latch amplifying unit 120 senses and amplifies a voltage level difference of data output from the current input amplifying unit 110 on a pair of differential output signal lines CSAO and CSAOB and latches the result.

The current input amplifying unit 110 may, for example, include a load circuit 112, first and second output transistors PA1 and PA2, first and second load resistors RA1 and RA2, and a switch SWA. The load circuit 112 may control the amount of current IA1 and IA2 flowing through the current input amplifying unit 110. In other words, the amount of current IA1 and IA2 flowing through the current input amplifying unit 110 may vary depending on the impedance of the load circuit 112.

The load circuit 112 may, for example, be equipped with first through fourth load transistors PL1, PL2, PL3, and PL4. Transistors PL1, PL2, PL3, and PL4 may, for example, be implemented as PMOS transistors and may have similar electrical characteristics. Transistors PL1, PL2, PL3, and PL4 are coupled to the other elements of the load circuit 112, i.e., VCC and the differential input signal lines IN and INB, as shown in FIG. 1. A first control signal XCON may be applied to the gate of each of the first and fourth load transistors PL1 and PL4, while a second control signal READB may be applied to the gate of each of the second and third load transistors PL2 and PL3.

The current input amplifying unit 110 may further include first and second output transistors PA1 and PA2 which may be implemented as PMOS transistors, each having the similar electrical characteristics. The transistors PA1 and PA2 are connected to the pair of differential input signal lines INB and IN and to output nodes NA2 and NA1 of the current input amplifying unit 110 as shown in FIG. 1.

As shown in FIG. 1, terminals on one side of the first and second load resistors RA1 and RA2, which may have the same resistance, are connected to the output nodes NA2 and NA1, respectively, while terminals on the other side are connected to a common source node NCS. The switch SWA may be implemented as an NMOS transistor which may be gated by the sense amplifier enable signal SAEN. The drain of the NMOS transistor SWA is coupled to the common source node NCS, and the source thereof is connected to a ground voltage VSS.

The gain of the current input amplifying unit 110 discussed above may be determined by the size of the transistors and resistors used to construct the current input amplifying unit 110. For example, the gain of the current input amplifying unit 110 may be increased by increasing the size of the first and the second output transistors PA1 and PA2. Although, if the size of the first and second output transistors gets too large, the differential output signal lines CSAO and CSAOB may oscillate, increasing the possibility of outputting invalid data. Therefore, the size of the first and second output transistors PA1 and PA2 may be limited to inhibit oscillations.

Accordingly, in order to prevent oscillation of the differential output signal lines CSAO and CSAOB while continuing to provide a sufficient gain, the present invention provides a current input amplifying unit 110 having varying gain characteristics during the course of a normal data read operation, for example, a first gain during a first part of a sense and amplify time interval and a second gain during a second part of a sense and amplify time interval. A detailed description of a current amplifier having gain characteristics that inhibit oscillation is provided in U.S. Pat. No. 6,281,713 to Kim entitled Current Sense Amplfiers Having Equalization Circuits Therein That Inhibit Signal Oscillations During Active Modes, the disclosure of which is incorporated herein by reference as if set forth in its entirety.

In some embodiments of the present invention, the load of the load circuit 112 may be controlled. In other words, the gain of the current input amplifying unit 110 may be controlled by switching the transistors of the load circuit 112 on and off to produce a desired gain. For example, during a first part of a sense and amplify time interval a column select signal CSL is activated to a logic "high" level and the transistors PL1, PL2, PL3, and PL4 of the load circuit 112 are all turned on to provide a first gain for the first part of the sense and amplify time interval. During a second part of the sense and amplify time interval, a column select line signal CSL is deactivated to a logic "low" level and some of the transistors of the load circuit 112, for example, the first and fourth load transistors PL1 and PL4, are turned off to provide a second gain for the second part of the sense and amplify time interval that follows the first part of the sense and amplify time interval. Thus, the possibility that the differential output signal lines CSAO and CSAOB will oscillate may be prevented by temporarily lowering the gain of the current input amplifying unit 110 during the second part of the sense and amplify time interval.

As described above, in order to provide the first gain and the second gain for the current input amplifying unit 110, a first control signal XCON is applied to the gates of the first and fourth load transistors PL1 and PL4, and a second control signal READB is applied to the gates of the second and third load transistors PL2 and PL3. In other words, the load circuit 112 is divided into a first transistor group controlled by the first control signal XCON and a second transistor group controlled by the second control signal READB. Thus, the impedance of the load circuit 112 is controlled by the first and second control signals XCON and READB. The processes of controlling the impedance of the load circuit 112 by the first and second control signals XCON and READB and of controlling the gain of the current input amplifying unit 110 depending on the load will be described further below with respect to the timing diagram of FIG. 2.

The latch amplifying unit 120 may include first through fourth load transistors PM1, PM2, MN1, and MN2, first and second driving transistors ND1 and ND2, and a latch switch SWL. The first and second load transistors PM1 and PM2 may be implemented as PMOS transistors. The sources of the first and second load transistors PM1 and PM2 are connected to a supply voltage VCC, and the drains thereof are connected to second and first latch nodes NL2 and NL1, respectively. The gates and the drains thereof are cross-coupled, as illustrated. The third and fourth load transistors MN1 and MN2 may be implemented as NMOS transistors. The drains of the third and fourth transistors MN1 and MN2 are connected to the first and second latch nodes NL1 and NL2, respectively, and the sources thereof are connected to the drains of the first and second driving transistors ND1 and ND2, respectively. Furthermore, the gates and the drains thereof are cross-coupled. Thus, the gate of the first load transistor PM1, the gate of the third load transistor MN1, the drain of the second load transistor PM2, and the drain of the fourth load transistor MN2 form a common connection at the first latch node NL1. The gate of the second load transistor PM2, the gate of the fourth load transistor MN2, the drain of the first load transistor PM1, and the drain of the third load transistor MN1 form a common connection at the second latch node NL2.

The gates of the first and second driving transistors ND1 and ND2 are connected to the output nodes NA1 and NA2, respectively. The drains of the first and second driving transistors ND1 and ND2 are connected to the sources of the third and fourth load transistors MN1 and MN2, respectively, and the sources of the first and second driving transistors ND1 and ND2 are commonly coupled to the latch switch SWL. The latch switch SWL may be implemented as an NMOS transistor which may be gated by a latch amplifying unit driving signal LATCH. Here, the drain of the NMOS transistor SWL is commonly coupled to the sources of the first and second driving transistors ND1 and ND2, and the source thereof is connected to a ground voltage VSS. The latch switch SWL controls the operation of the latch amplifying unit 120. In other words, if the latch amplifying unit driving signal LATCH is activated to a logic "high" level, then the latch amplifying unit 120 is enabled, while if the latch amplifying unit driving signal LATCH is deactivated to a logic "low" signal, then the latch amplifying unit 120 is disabled.

Figure 2:
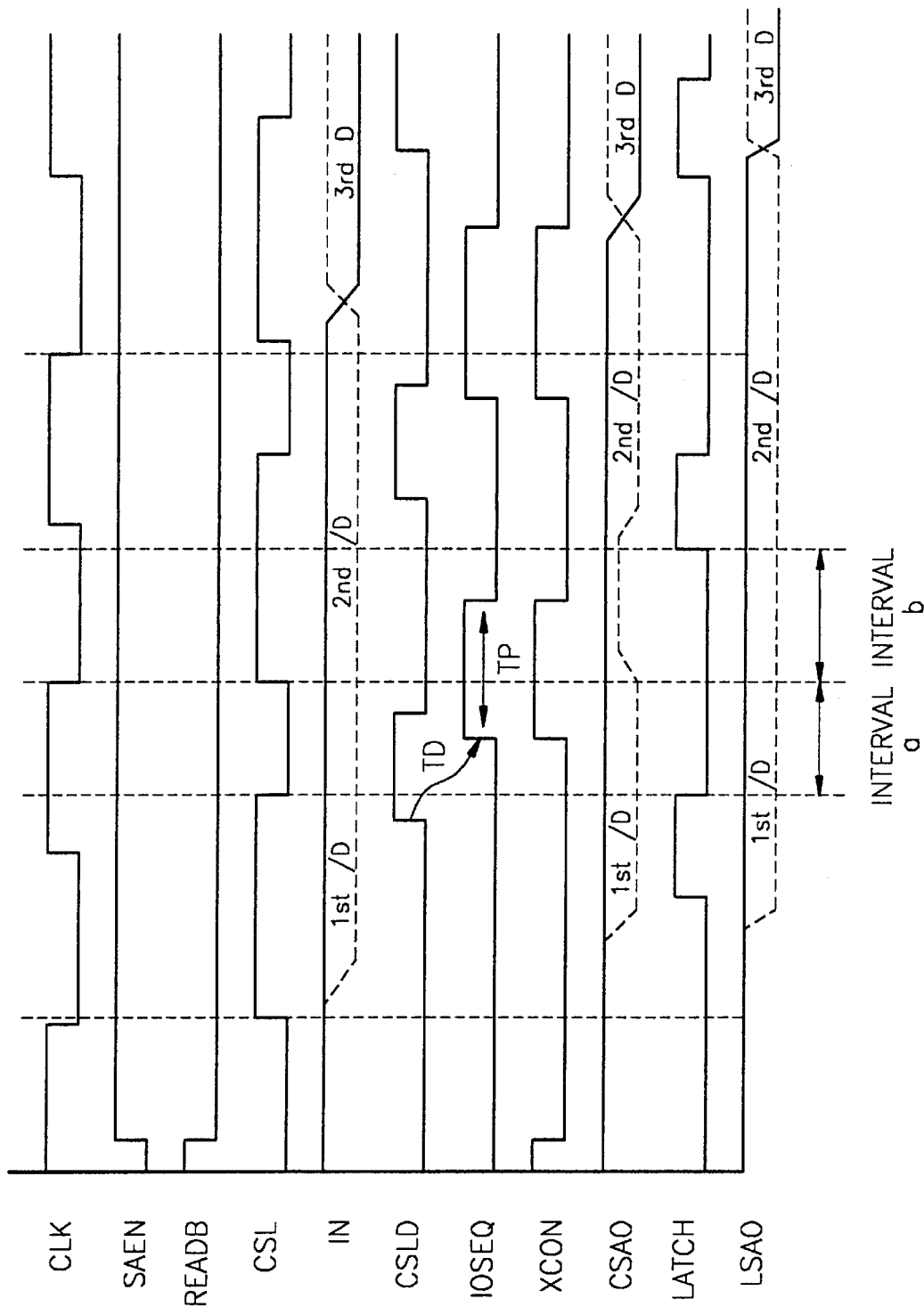
FIG. 2 is a timing diagram illustrating waveforms corresponding to signals of the sense amplifier of embodiments of the present invention illustrated in FIG. 1.

The operation of the sense amplifier of FIG.1 according to embodiments of the present invention will now be described with reference to FIGS. 1 and 2. FIG. 2 is a timing diagram illustrating waveforms corresponding to signals of the sense amplifier discussed above with respect to FIG. 1. When a read command signal of the semiconductor device is activated, a sense amplifier enable signal SAEN is activated to a logic "high" level. When the sense amplifier enable signal SAEN is activated, the switch SWA is turned on. Furthermore, the second and third load transistors PL2 and PL3 are turned on in response to a complementary read command signal READB, which is the second control signal. In this case, the first and fourth load transistors PL1 and PL4 are turned on in response to a first control signal XCON. Thus, a current path is formed between the supply voltage VCC and the ground voltage VSS.

When the complementary read command signal READB, which is the second control signal, is activated to a logic "high" level, the read command signal becomes "low". Thus, while the current input amplifying unit 110 senses and amplifies data on the pair of differential input signal lines IN and INB, the complementary read command signal READB is at a logic "low" level, and thus the second and third load transistors PL2 and PL3 are on during the entire sense and amplify time interval of the current input amplifying unit 110. Although the present description of the invention utilizes the complementary signal READB of the read command signal as the second control signal, it will be understood that the read command signal may be directly used as well.

The first control signal XCON may be a logical sum (OR) of the complementary read command signal READB and an amplify control signal IOSEQ, as shown in FIG. 1. The amplify control signal IOSEQ is activated to a "high" level after a predetermined time TD has lapsed after a column select disable signal CSLD determining the disable timing of a column select signal CSL is activated, and is automatically deactivated to a "low" level after having been activated for a predetermined time TP. It may be desirable for the amplify control signal IOSEQ to remain activated during an interval a where the column select signal CSL is at a "low" level, after having been activated to a "high" level. Furthermore, it may desirable to deactivate the amplify control signal IOSEQ for a predetermined time before the next latch amplifying unit driving signal LATCH is activated, that is, the end of an interval b. The first and fourth load transistors PL1 and PL4 are turned off while the first control signal XCON is at a "high" level.

The column select signal CSL is a signal used to output data on a pair of bit lines BL and BLB amplified in a bit line amplifying unit 130 to a pair of differential input signal lines IN and INB. Activating the column select signal CSL causes data from the bit line amplifying unit 130 to be transmitted to the pair of input data lines IN and INB. For example, assume that data at a logic "high" level is output to the differential input signal line IN and data at a logic "low" level is output to the complementary differential input signal line INB, as the current path of the current input amplifying unit 110 is formed, the resistance of the first output transistor PA1 will increase while the resistance of the second output transistor PA2 will decrease. This may cause a difference between first current IA1 flowing through the first output transistor PA1 and second current IA2 flowing through the second output transistor PA2.

Since the first and second load resistors RA1 and RA2 may have similar electrical characteristics, and the terminals on one side of the first and second load resistors RA1 and RA2 connected to the common source node NCS have the same voltage level, the difference between voltages in which the difference between the first and second current IA1 and 1A2 is reflected occurs at the terminals on the other side of the first and second load resistors RA1 and RA2. Since, in the present example, the second current IA2 increases more than the first current IA1, the level of the voltage of the first output node NA1 will increase slightly more than the level of the voltage of the second output node NA2. In other words, the differential input signal lines IN and INB are sensed and amplified to be on the output nodes NA1 and NA2.

A latch amplifying unit driving signal LATCH is activated in order to latch the differential output signal lines CSAO and CSAOB on the output nodes NA1 and NA2. When the latch amplifying unit driving signal LATCH is activated to a logic "high" level, the latch amplifying unit 120 is enabled. Since the voltage level of the differential output signal line CSAO is higher than that of the complementary differential output signal line CSAOB, this turns on the first driving transistor ND1, and lowers the voltage level of the drain of the first driving transistor ND1. Thus, the third load transistor MN1 is turned on, and the voltage level of the drain of the third load transistor MN1, i.e., the second latch node NL2, becomes lower. As the voltage of the second latch node NL2 becomes lower, the second load transistor PM2 is turned on harder than the fourth load transistor MN2, so that the voltage level of the first latch node NL1 becomes high. Due to such a sensing and amplifying operation, the voltages of the first and second latch nodes NL1 and NL2 are amplified to a supply voltage VCC level and a ground voltage VSS level, respectively. Data on the latch nodes NL1 and NL2 are output as output data of the sense amplifier and transmitted to a peripheral circuit (not shown).

Returning to FIG. 2, an example of operations of the sense amplifier according to embodiments of the present invention is shown. First and second data on a differential input signal line IN are denoted by "/D", and third data on the input data line IN is denoted by "D". In this case, for convenience of explanation, it is assumed that "D" and "/D" mean "high" level data and "low" level data, respectively. Each time the column select signal CSL is activated, data is present on the pair of differential input signal lines IN and INB. In the first part of the sense and amplify time interval of the current amplifying unit 110, i.e., before the amplify control signal IOSEQ is activated, data on the differential input signal line IN is sufficiently amplified and output as the output signal CSAO of the current input amplifying unit 110 since the gain of the current input amplifying unit 110 is large. When the amplify control signal IOSEQ is activated, the output signal CSAO of the current input amplifying unit 110 does not oscillate since the gain of the current input amplifying unit 110 is reduced. The oscillation in the second part of a sense and amplify time interval may cause an error in subsequent data. Therefore, the gain in the second part of a sense and amplify time interval is suppressed, thereby significantly reducing the possibility of generating invalid data. As illustrated in FIG. 2, output data LSAO of the latch amplifying unit 120 that outputs signals "/D", "/D", and "D" having the same values as data on the differential input signal line IN is continuously latched.

Figure 3:
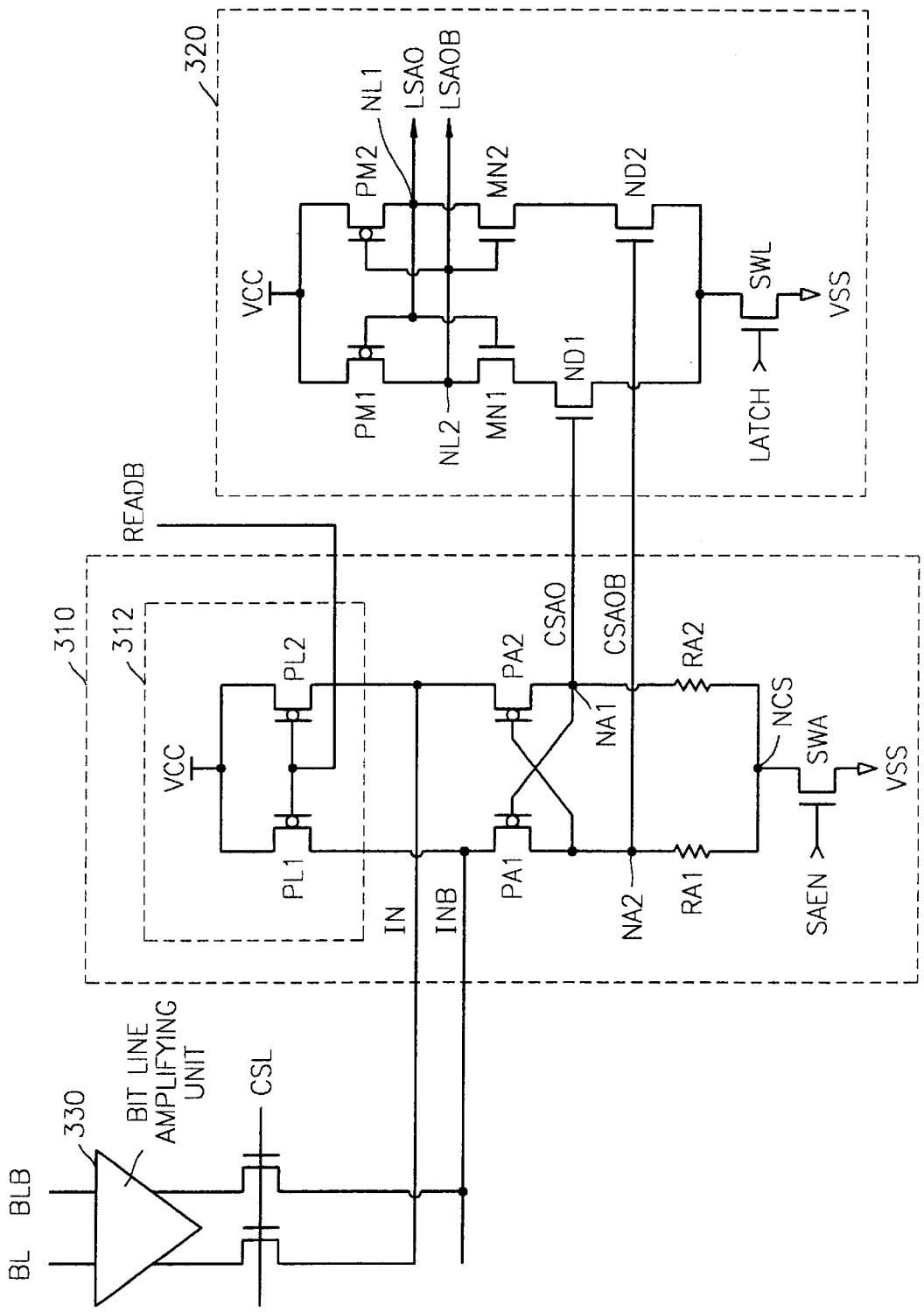
FIG. 3 illustrates a conventional output data amplifier of a semiconductor device.

Now referring to FIG. 3, the functionality of a conventional output data amplifier will be described. The gain of the current input amplifying unit is typically fixed during normal operation of a conventional semiconductor device. The output data amplifier of FIG. 3 may include a pair of differential input signal lines IN and INB, a current input amplifying unit 310, and a latch amplifying unit 320. The pair of differential input signal lines IN and INB and the latch amplifying unit 320 may have the same configuration as their counterparts illustrated in FIG. 1.

The current input amplifying unit 310 is similar to the current input amplifying unit 110 shown in FIG. 1, but the current amplifying unit 310 includes a different load circuit 312, first and second output transistors PA1 and PA2, first and second load resistors RA1 and RA2, and a switch SWA. The load circuit 312 is equipped with first and second load transistors PL1 and PL2. The first and second load transistors PL1 and PL2 may be implemented as PMOS transistors. First and second load transistors PL1 and PL2 are coupled to a supply voltage VCC and to the pair of differential input signal lines INB and IN as shown in FIG. 3. A complementary read command signal READB is applied to the gate of each of the first and second load transistors PL1 and PL2.

Figure 4:
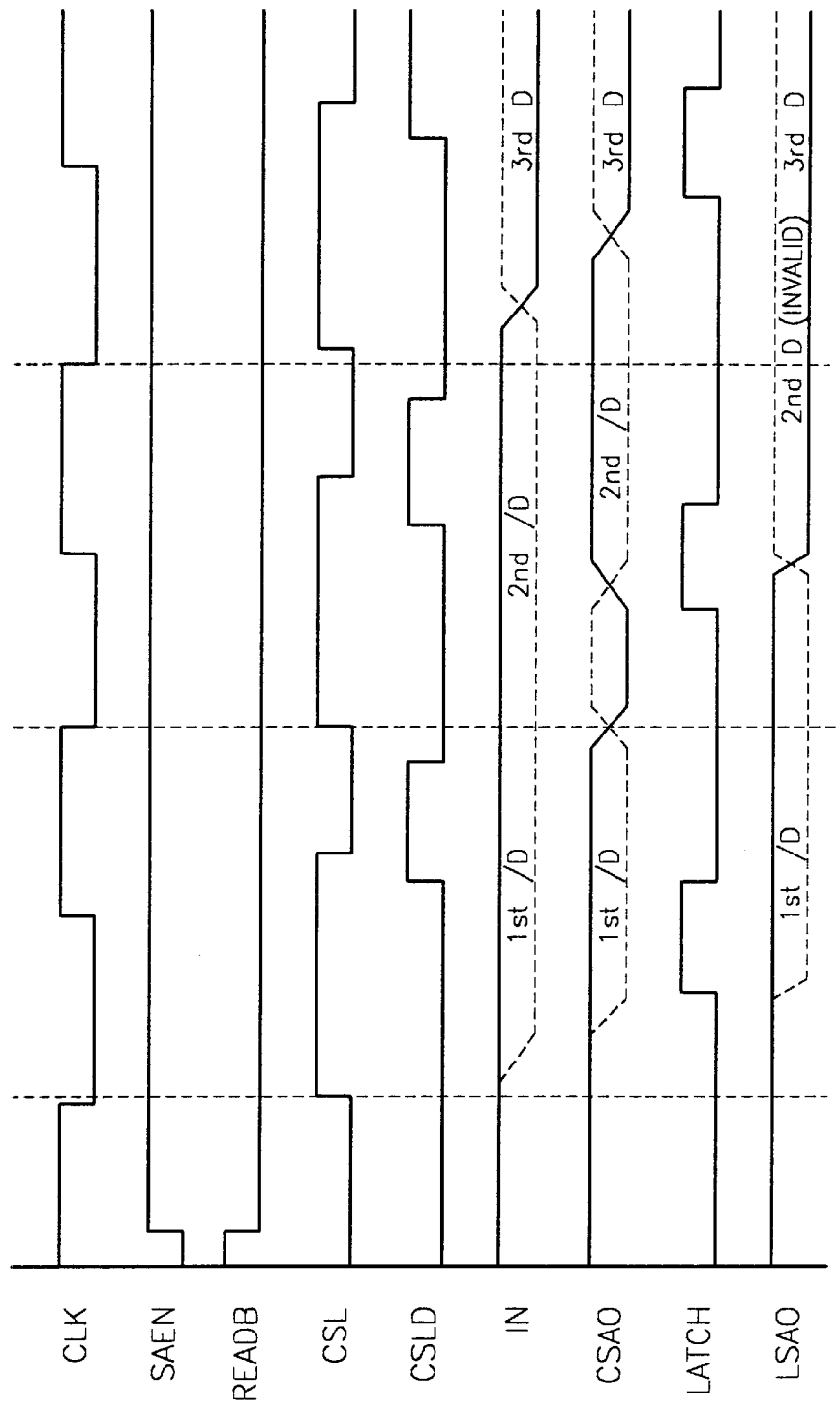
FIG. 4 is a timing diagram illustrating waveforms corresponding to signals of the conventional output data amplifier of the semiconductor device illustrated in FIG. 3.

Now referring to FIG. 4, operations of the conventional output data amplifier of FIG. 3 will be described. FIG. 4 is a timing diagram illustrating waveforms corresponding to signals of the output data amplifier of the semiconductor device shown in FIG. 3. When a read command signal of the semiconductor device is activated, a sense amplifier enable signal SAEN is activated to a logic "high" level, which turns the switch SWA on. In response to a complementary read command signal READB, the first and second load transistors PL11 and PL2 are turned on. Thus, the first and second load transistors PL1 and PL2 are typically on during an entire sense and amplify interval of the current input amplifying unit 310, and the gain of the current input amplifying unit 310 is typically fixed. Therefore, in the second part of the sense and amplify time interval when a column select signal CSL is disabled, there is a high possibility that differential output signal lines CSAO and CSAOB of the current input amplifying unit 310 will oscillate. In particular, if the continuous data received on the differential input signal line IN has the same logic value, there is a high possibility that invalid data will be generated due to oscillation of the differential output signal line CSAO.

First and second data on the differential input signal line IN are denoted by "/D", and third data on the differential input signal line IN is denoted by "D". As illustrated in FIG. 4, output data LSAO oscillates during the second part of the sense and amplify interval in which the first data /D on the input data line IN is amplified, thus, invalid data is generated. Embodiments of the present invention may reduce the possibility that the output data of the current input amplifying unit of an amplifier will oscillate compared to conventional data output amplifiers similar to the circuit in FIG. 3. Accordingly, the possibility of generating invalid data using the sense amplifier according to embodiments of the present invention is reduced.

Figure 5:
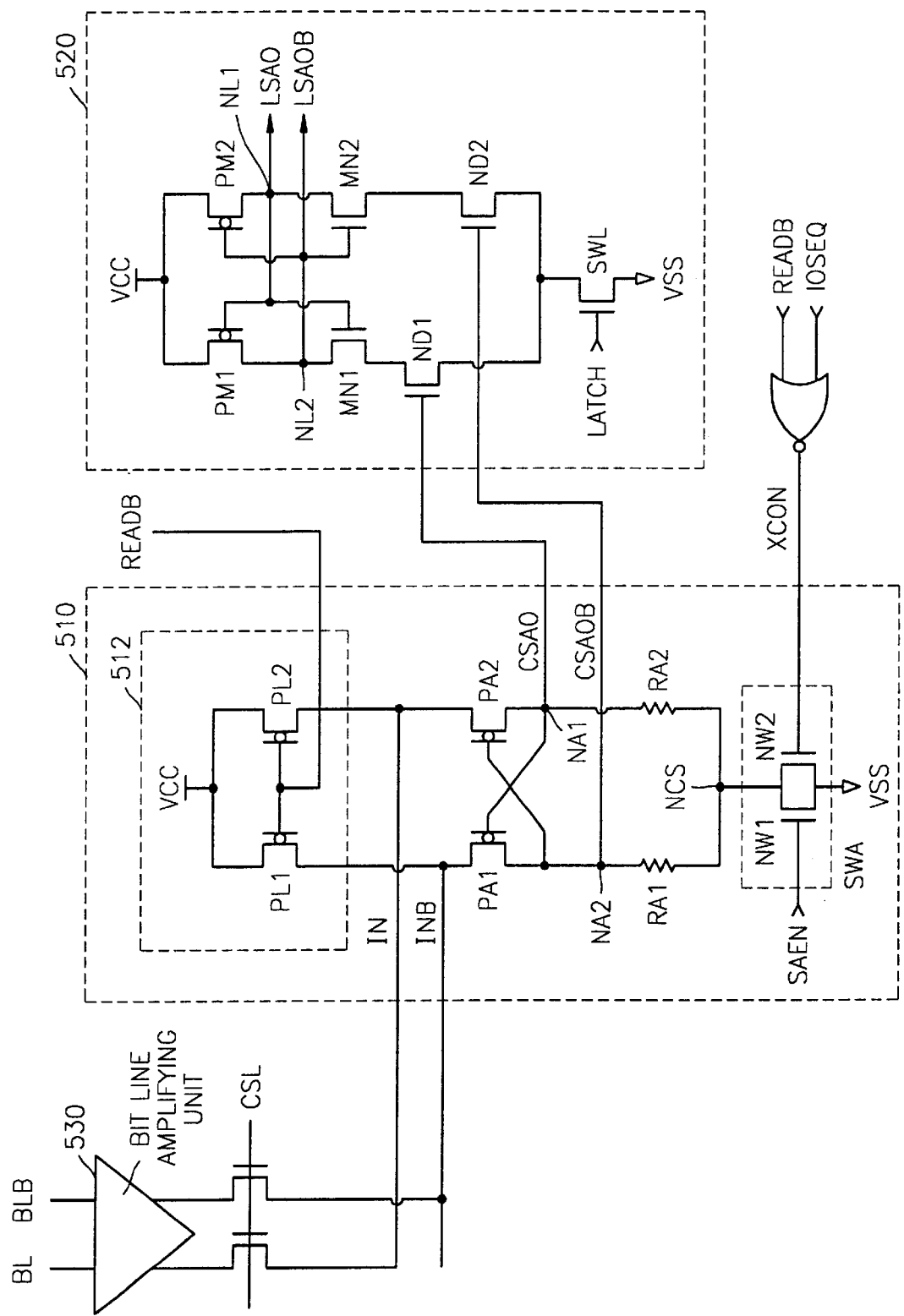
FIG. 5 illustrates a sense amplifier of a semiconductor device according to other embodiments of the present invention.

Now referring to FIG. 5, a sense amplifier of a semiconductor device according to further embodiments of the present invention will be described. The sense amplifier illustrated in FIG. 5 may include a pair of differential input signal lines IN and INB, a current input amplifying unit 510, and a latch amplifying unit 520. The function of each of the elements illustrated in FIG. 5 are similar to the elements described above with respect to FIG. 1, and thus their description will be omitted. Furthermore, since the configuration of the pair of differential input signal lines IN and INB and the latch amplifying unit 520 is similar to that of their counterparts in FIG. 1, their description will also be omitted.

The current input amplifying unit 510 includes a load circuit 512, first and second output transistors PA1 and PA2, first and second load resistors RA1 and RA2, and a switch portion SWA. The load circuit 512 is equipped with first and second load transistors PL1 and PL2. The first and second load transistors PL1 and PL2 may be implemented as PMOS transistors and may have the same electrical characteristics. The first and second load transistors PL1 and PL2 are connected to a supply voltage VCC and the pair of differential input signal lines INB and IN as shown in FIG. 5. A complementary read command signal READB may be applied to the gate of each of the first and second load transistors PL1 and PL2. The first and second output transistors PA1 and PA2 may have the same electrical characteristics and may also be implemented as PMOS transistors. The sources of the first and second output transistors PA1 and PA2 are connected to the pair of differential input signal lines INB and IN, respectively, and the gates and the drains are cross-coupled. The drains thereof are coupled to output nodes NA2 and NA1 of the current input amplifying unit 510, respectively.

Terminals on one side of the first and second load resistors RA1 and RA2 are connected to the output nodes NA2 and NA1, respectively, while terminals on the other side thereof are connected to a common source node NCS. The first and second load resistors RA1 and RA2 may have the same resistance. The switch portion SWA may be implemented as first and second switching transistors NW1 and NW2, which may be NMOS transistors, the drains of which are commonly coupled to the common source node NCS, and the sources of which are commonly connected to a ground voltage VSS. The first and second switching transistors NW1 and NW2 are gated by a sense amplifier enable signal SAEN and a control signal XCON, respectively. Here, the control signal XCON is a logical NOR signal of the complementary read command signal READB and the amplify control signal IOSEQ. Like the amplify control signal IOSEQ discussed above with respect to FIG. 1, the amplify control signal IOSEQ is activated to a "high" level when a predetermined period of time lapses after the activation of a column select disable signal CSLD determining the disable timing of a column select signal CSL, and is automatically deactivated to a "low" level after having been activated for a predetermined period of time. Thus, in the first part of sense and amplify time interval, in which the complementary read command signal READB and the amplify control signal IOSEQ are driven "low", the second switching transistor NW2 is turned on, while in the second part of a sense and amplify time interval, in which the amplify control signal IOSEQ is driven "high", the second switch transistor NW2 is turned off.

Thus, the voltage of the common source node NCS differs in the first part and second part of a sense and amplify time interval. As a result, in the first part of the sense and amplify time interval, the first and second switching transistors NW1 and NW2 are turned on, so that the gain of the current input amplifying unit 510 is large. In the second part of the sense and amplify time interval, the first switching transistor NW1 is turned on and the second switching transistor NW2 is turned off, so that the gain of the current input amplifier 510 is reduced compared to the first part of a sense and amplify time interval. As a consequence the current input amplifying unit 510 provides different gains corresponding to first and second parts of the sense and amplify time interval, thus, significantly reducing the possibility of oscillation of output data.

Figure 6:
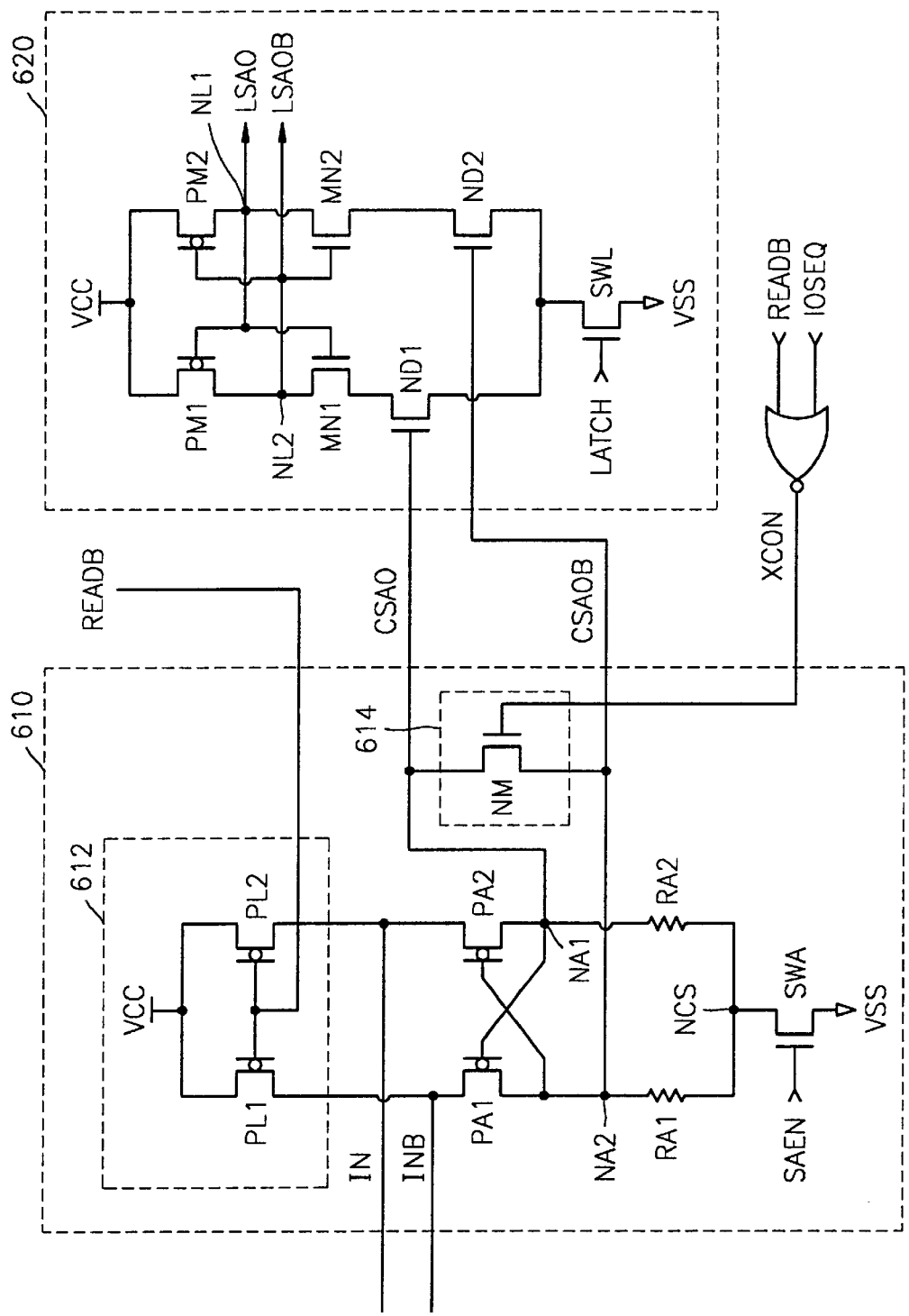
FIG. 6 illustrates a sense amplifier of a semiconductor device according to further embodiments of the present invention.

Now referring to FIG. 6, a sense amplifier of a semiconductor device according to further embodiments of the present invention will be described. The sense amplifier may include a pair of differential input signal lines IN and INB, a current input amplifying unit 610, and a latch amplifying unit 620. The functions of these element are similar to those described with respect to FIG. 1, and thus their description will be omitted. Furthermore, since the configurations of the pair of differential input signal lines IN and INB and the latch amplifying unit 520 are similar these elements described with respect to FIG. 1, their description will be omitted.

The current input amplifying unit 610 includes a load circuit 612, first and second output transistors PA1 and PA2, first and second load resistors RA1 and RA2, an output voltage stabilizing circuit 614, and a switch SWA. The current input amplifying unit 610 has a similar configuration as the current input amplifying unit 310 shown in FIG. 3, except for the output voltage stabilizing circuit 614. The output voltage stabilizing circuit 614 may be implemented as an NMOS transistor NM, the drain and source of which are coupled to output nodes NA1 and NA2, respectively. A control signal XCON is applied to the gate of the NMOS transistor NM in the output voltage stabilizing circuit 614. In this respect, the control signal XCON is a logical NOR signal of a complementary read command signal READB and an amplify control signal IOSEQ, like the control signal XCON discussed above with respect to FIG. 5. The NMOS transistor NM of the output voltage stabilizing circuit 614 is turned on in the former part of amplification in which the complementary read command signal READB and the amplify control signal IOSEQ are at a "low" level. The NMOS transistor NM is turned off when the amplify control signal IOSEQ is activated to a "high" level.

Thus, in the second part of the sense and amplify time interval of the current input amplifying unit 610, since the NMOS transistor NM of the output voltage stabilizing circuit 614 is turned on, there is a limit to the voltage difference between output nodes NA1 and NA2. As a result, the extreme amplification in the voltage level of the output nodes NA1 and NA2 can be suppressed to accomplish stable amplifying operation.

Figure 7:
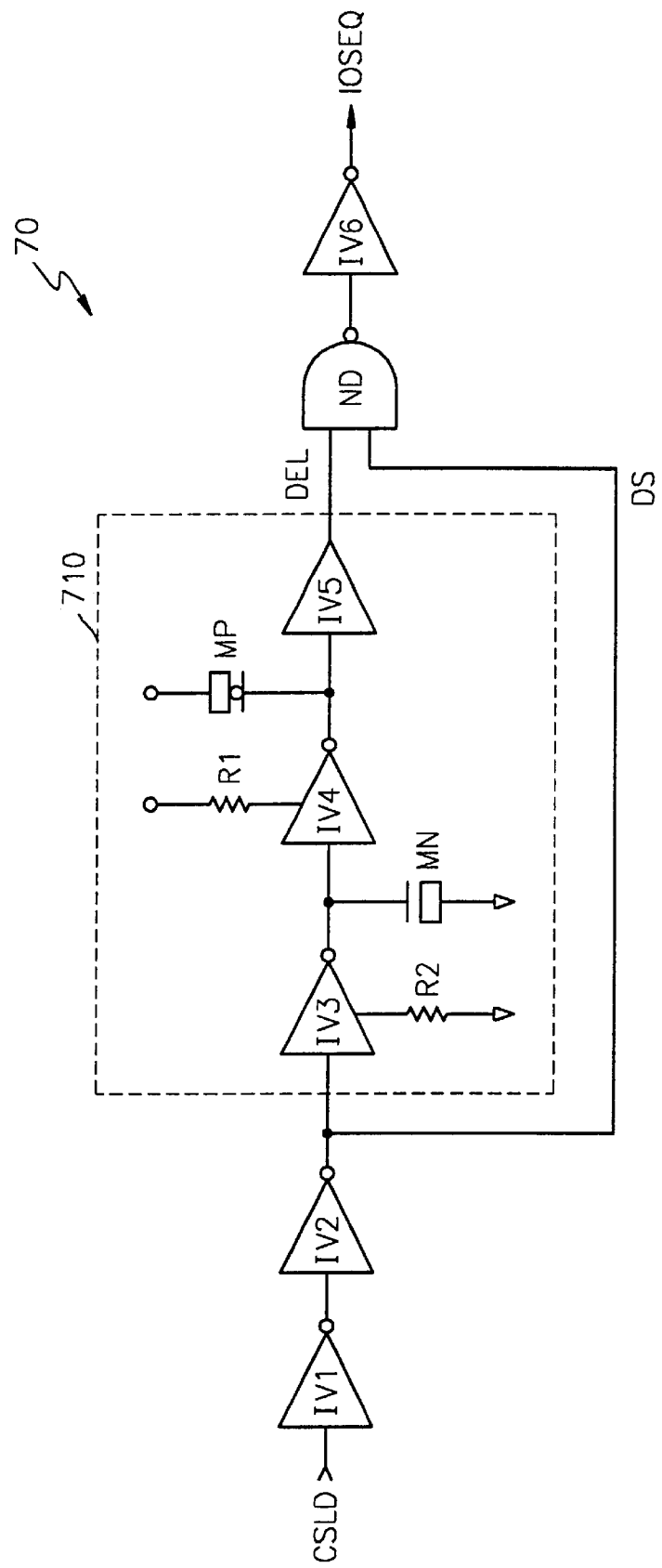
FIG. 7 illustrates a generating unit used in conjunction with embodiments of the present invention.

Now referring to FIG. 7, a generating unit for use in conjunction with embodiments of the present invention will be discussed. An amplifying control signal generating unit 70 receives a column select disable signal CSLD. The amplify control signal generating unit 70 includes first through sixth inverters IV1–IV6, resistors R1 and R2, MOS transistors MN and MP and a NAND gate ND.

The column select disable signal CSLD is branched after passing through the first and second inverters IN1 and IN2. One branch of the signal DS is input directly to the NAND gate ND, while the other branch of the signal is input into a pulse width determining unit 710. The pulse width determining unit 710 is a circuit determining the pulse width of an amplify control signal IOSEQ, i.e., an activation time thereof, and includes the third through fifth inverters (IN3–IN5), the resistors R1 and R2, and the MOS transistors MN, each of which serves as a capacitor. Thus, the pulse width determining unit 710 delays an input signal by a predetermined time, inverts the signal, and outputs the result. An output signal DEL of the pulse width determining unit 710 is input into the NAND gate ND. As a result, the amplify control signal IOSEQ is activated after being delayed slightly more than the column select disable signal CSLD, and has a pulse width, i.e., the activation time, corresponding to the delay time in the pulse width determining unit 710. Accordingly, the activation time of the amplify control signal IOSEQ can be controlled depending on capacitance values by the resistors R1 and R2 and the MOS transistors MP and MN.

Thus, integrated circuit memory devices according to embodiments of the present invention provide a sense amplifier including a pair of differential input signal lines, a pair of differential output signal lines and a current amplifier. The current amplifier has an input stage electrically coupled to the pair of differential input signal lines and a n output stage electrically coupled to the pair of differential output signal lines. The input stage and/or the output stage may be responsive to a first control signal that reduces a gain of the current amplifier when the first control signal is asserted.

In further embodiments of the present invention the input stage of the current sense amplifier may include a load circuit that is electrically coupled to the pair of differential input signal lines and a first reference signal line. The load circuit may be responsive to the first control signal and a second control signal. During a sense and amplify time interval, an impedance of a load provided by the load circuit to the pair of differential input signal lines may increase from a first level when the second control signal is being asserted and the first control signal is not being asserted to a second level, higher than the first level, when the first and second control signals are both being asserted.

In other embodiments of the present invention, the output stage may include an enable circuit that is electrically coupled to the pair of differential output signal lines and a second reference signal line. The enable circuit may be responsive to the first control signal and an enable signal. During a sense and amplify time interval, an impedance of a load provided by the enable circuit to the pair of differential output signal lines may increase from a third level when the enable signal is being asserted and the first control signal is not being asserted to a fourth level, higher than the third, level when the first control signal and enable signal are both being asserted.

In still further embodiments of the present invention the output stage may include a stabilizer circuit that is electrically coupled to the pair of differential output signal lines and a third reference signal line. The stabilizer circuit may be responsive to the first control signal. During a sense and amplify time interval, a magnitude of a load provided by said stabilizer circuit to the pair of differential output signal lines may increase from a fifth level to a sixth level when the first control signal is being asserted.

As described above, a sense amplifier circuit according to embodiments of the present invention may significantly reduce the possibility of generating oscillation in the output data amplifier of the semiconductor device. The stability of output data may prevent the malfunction of the semiconductor device. In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A sense amplifier integrated circuit, comprising:
    pair of differential input signal lines and a pair of differential output signal lines; and
    a current amplifier having an input stage electrically coupled to said pair of differential input signal lines and art output stage electrically coupled to said pair of differential output signal lines, said input stage or said output stage responsive to a first control signal that reduces a gain of said current amplifier when the first control signal is asserted, wherein said input stage comprises:
        a load circuit that is electrically coupled to said pair of differential input signal lines and a first reference signal line, wherein said load circuit is responsive to the first control signal and a second control signal; and wherein during a sense and amplify time interval, an impedance of a load provided by said load circuit to said pair of differential input signal lines increases from a first level when the second control signal is being asserted and the first control signal is not being asserted to a second level higher than the first level when the first and second control signals are both being asserted.

2. A sense amplifier integrated circuit, comprising:
    a pair of differential input signal lines and a pair of differential output signal lines; and
    a current amplifier having an input stage electrically coupled to said pair of differential input signal lines and an output stage electrically coupled to said pair of differential output signal lines, said output stage responsive to a first control signal tat reduces a gain of said current amplifier when the first control signal is asserted, wherein said output stage comprises:
        a stabilizer circuit that is electrically coupled to said pair of differential output signal lines, wherein said stabilizer circuit is responsive to the first control signal; and wherein during a sense and amplify time interval, an impedance of a load provided by said stabilizer circuit to said pair of differential output signal lines increases from a first level when the first control signal is not being asserted to a second level when the first control signal is being asserted.

3. An output data amplifier of a semiconductor device comprising:
    a pair of input data lines;
    a current input amplifying unit for sensing and amplifying a level difference between signals on the pair of input data lines and outputting a result as a voltage level; and
    a latch amplifying unit for sensing the voltage level output from the current input amplifying unit and amplifying the voltage level to a level sufficient to be transmitted to a peripheral circuit,
    wherein a gain of the current input amplifying unit during a first portion of a sense and amplify time interval is different from the gain of the current input amplifying unit during a second portion of the sense and amplify time interval.

4. The output data amplifier of claim 3, wherein the current input amplifying unit comprises:
    first and second output transistors wherein the sources are connected to the pair of input data lines, respectively, the gates and the drains are cross-coupled, and the drains are provided as first and second output nodes, respectively,
    a load circuit, provided between a supply voltage and the sources of the first and second transistors, for controlling the amount of current flowing through the current input amplifying unit;
    first and second load resistors having the same electrical characteristics wherein terminals on one side of the first and second load resistors are connected to the first and second output nodes, respectively, and terminals on the other side thereof are coupled to a common source node; and
    a switch provided between the common source node and a ground voltage, and the switch controlled by a sense amp enable signal activated when the semiconductor device goes into a read mode.

5. The output data amplifier of claim 4, wherein the load circuit comprises:
    a first PMOS transistor group gated by a first control signal, wherein the sources are connected to the supply voltage, and the drains are connected to the pair of input data lines, respectively; and
    a second PMOS transistor group gated by a second control signal, wherein the sources are connected to the supply voltage, and the drains are connected to the pair of input data lines, respectively,
    wherein transistors in the first PMOS transistor group and transistors in the second PMOS transistor group are connected in parallel, respectively,
    wherein a signal, which is activated when a predetermined period of time lapses after a column select disable signal for disabling a column select signal, and is automatically deactivated when a predetermined period of time lapses after it has been activated, is used as the first control signal, and
    wherein the second control signal is a read command signal of the semiconductor device.

6. The output data amplifier of claim 3, wherein the current input amplifying unit further comprises a switching transistor which is gated by a control signal,
    wherein the load circuit comprises PMOS transistors, gated by a complementary signal of a read command signal, wherein the sources are connected to the supply voltage and the drains are connected to the pair of input data lines, respectively, and
    wherein a signal, which is activated when a predetermined period of time lapses after a column select disable signal for disabling a column select signal is activated, and is automatically deactivated when a predetermined period of time lapses after having been activated, is used as the control signal.

7. The output data amplifier of claim 4, wherein the current input amplifier further comprises an output voltage stabilizing circuit which is connected between the first and second output nodes and controlled by a control signal, and wherein the voltage level difference between the first and second output nodes is limited within a predetermined range when operating the output voltage stabilizing circuit.

8. The output data amplifier of claim 7, wherein the output voltage stabilizing circuit is a MOS transistor gated by the control signal, wherein the drain of the MOS transistor is connected to one of the first and second output nodes, and the source thereof is connected to the other node, and wherein a signal, which is activated when a predetermined period of time lapses after a column select disable signal for disabling a column select signal is activated, and is automatically deactivated when a predetermined period of time lapses after having been activated, is used as the control signal.

9. An output data amplifier of a semiconductor device comprising:

a pair of input data lines;

a current input amplifying unit for sensing and amplifying a level difference between signals on the pair of input data lines and outputting a result as a voltage level; and a latch amplifying unit for sensing the voltage level output from the current input amplifying unit and amplifying the voltage level to a level sufficient to be transmitted to a peripheral circuit, wherein the current input amplifying unit comprises a load circuit for controlling an amount of current flowing through the current input amplifying unit, and wherein a load of the load circuit during a first portion of a sense and amplify time interval is different from the load of the load circuit during a second portion of the sense and amplify time interval.

10. The output data amplifier of claim 9, wherein the load circuit uses a signal which is activated when a predetermined period of time lapses after a column select disable signal for disabling a column select signal is activated, and is automatically deactivated when a predetermined period of time lapses after having been activated, in order to make the load during a first portion of a sense and amplify time interval different from the load during a second portion of the sense and amplify time interval.

11. An output data amplifier of a semiconductor device comprising:

a pair of input data lines;

a current input amplifying unit for sensing and amplifying the level difference between signals on the pair of input data lines and outputting the result as a voltage level; and a latch amplifying unit for sensing the voltage level output from the current input amplifying unit and amplifying the voltage level to a level sufficient to be transmitted to a peripheral circuit, wherein the current input amplifying unit comprises an output voltage stabilizing circuit for limiting the voltage level output from the current input amplifying unit, wherein the output voltage stabilizing circuit is a MOS transistor having a drain connected to one of output nodes of the current input amplifying unit and the source connected to the other node, which is gated by a control signal, and wherein a signal, which is activated when a predetermined period of time lapses after a column select disable signal for disabling a column select signal is activated, and is automatically deactivated when a predetermined period of time lapses after having been activated, is used as the control signal.

* * * * *